United States Patent
Cheung et al.

(10) Patent No.: US 6,914,832 B2
(45) Date of Patent: Jul. 5, 2005

(54) SEMICONDUCTOR MEMORY DEVICE WITH MEMORY CELL ARRAY DIVIDED INTO BLOCKS

(75) Inventors: Andy Cheung, Kawasaki (JP); Yasushi Oka, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 133 days.

(21) Appl. No.: 10/652,563

(22) Filed: Sep. 2, 2003

(65) Prior Publication Data

US 2004/0085799 A1 May 6, 2004

(30) Foreign Application Priority Data

Sep. 13, 2002 (JP) .................................... 2002-268314

(51) Int. Cl.$^7$ .............................................. G11C 7/00
(52) U.S. Cl. .................................. 365/200; 365/230.03
(58) Field of Search ............................ 365/200, 230.03

(56) References Cited

U.S. PATENT DOCUMENTS

| | | | | |
|---|---|---|---|---|
| 5,268,866 A | * | 12/1993 | Feng et al. | 365/200 |
| 5,673,227 A | * | 9/1997 | Engles et al. | 365/200 |
| 5,953,745 A | * | 9/1999 | Lattimore et al. | 711/162 |
| 6,560,728 B2 | * | 5/2003 | Merritt | 714/711 |

FOREIGN PATENT DOCUMENTS

JP  6-150644  5/1994

* cited by examiner

Primary Examiner—Son Mai
(74) Attorney, Agent, or Firm—Arent Fox, PLLC

(57) ABSTRACT

A semiconductor memory device includes a plurality of blocks, each of which includes a memory cell array, and outputs data signals and a redundancy signal. The semiconductor memory device further includes at least one first multiplexer which is coupled to the blocks, and selects one of the blocks, and a second multiplexer which performs redundancy processing based on the data signals and the redundancy signal which have undergone block selection by the first multiplexer.

7 Claims, 7 Drawing Sheets

SEMICONDUCTOR MEMORY DEVICE WITH MEMORY CELL ARRAY DIVIDED INTO BLOCKS

CROSS-REFERENCE TO RELATED APPLICATIONS

The present application is based upon and claims the benefit of priority from the prior Japanese Patent Application No. 2002-268314 filed on Sep. 13, 2002, with the Japanese Patent Office, the entire contents of which are incorporated herein by reference.

BACKGROUND OF THE INVENTION

1. Field of the Invention

The present invention generally relates to semiconductor memory devices, and particularly relates to a semiconductor memory device in which a memory cell array is divided into a plurality of blocks.

2. Description of the Related Art

In semiconductor memory devices such as DRAMs (Dynamic Random Access Memories) and flash memories, a memory cell array is divided into a plurality of blocks, with peripheral circuits of the memory core such as an X decoder, a Y decoder, and sense amplifiers being provided separately for each block. Such division into blocks brings about advantages such as high-speed data access by reducing the load on the bit lines and word lines.

When a memory cell array is divided into a plurality of blocks, a multiplexer needs to be provided for the purpose of selecting an output of a selected one of the blocks at the time of data reading for supply to an output circuit.

FIG. 1 is a block diagram showing an example of the construction of a related-art semiconductor memory device in which a memory cell block is divided into a plurality of blocks.

The semiconductor memory device of FIG. 1 includes memory cell arrays 11-0 through 11-3, sense amplifiers 12-0 through 12-3, a multiplexer 13, an output circuit 14, a control circuit 15, buffers 16-0 through 16-3, redundancy bit signal lines 17-0 through 17-3, and data signal lines 18-0 through 18-3.

The memory cell arrays 11-0 through 11-3 include memory cells arranged in rows and columns, a plurality of word lines, a plurality of bit lines, an X decoder for selecting a word line, and a Y decoder for selecting a Y address. Data access to the memory cell arrays 11-0 through 11-3 is controlled by the control circuit 15. The sense amplifiers 12-0 through 12-3 are provided for the respective memory cell arrays 11-0 through 11-3, and amplify data read from memory cells. The amplified data is supplied to the multiplexer 13 through the data signal lines 18-0 through 18-3. Similarly, redundancy bit signals read from the memory cell arrays 11-0 through 11-3 are amplified by the respective sense amplifiers 12-0 through 12-3. The amplified signals are then supplied to the multiplexer 13 through the redundancy bit signal lines 17-0 through 17-3. In this example, data signals DSIB(63:0)_n read from each memory cell array 11-n (n=0–3) are comprised of 64 bits, and a redundancy bit signal DSIBRED_n is 1 bit.

The multiplexer 13 decides whether to replace 64-bit of the data signals DSIB(63:0)_n with the redundancy bit DSIBRED_n based on 64-bit redundancy selection signals RED(63:0)_n. Furthermore, the multiplexer 13 selects a read signal that corresponds to one of the memory cell arrays (blocks) 11-0 through 11-3. Such selection is made based on block selection signals MUX_(3:0). This achieves 4-to-1 data selection. Furthermore, the multiplexer 13 selects one of the four pages defined by respective 16-bit subsets of 64 bits based on page selection signals PAGE(3:0). The multiplexer 13 thus supplies 16-bit output data to the output circuit 14.

FIG. 2 is a circuit diagram showing a portion of the multiplexer 13.

The portion of the multiplexer 13 shown in FIG. 2 is a circuit section that performs redundancy bit replacement and page selection. The circuit of FIG. 2 relates to the data signals DSIB(63:0)_0 and the redundancy bit signal DSIBRED_0 supplied from the memory cell array 11-0. A circuit construction the same as that of. FIG. 2 is provided for each of the memory cell array 11-1, the memory cell array 11-2, and the memory cell array 11-3.

The circuit of FIG. 2 includes selector circuits 20-0 through 20-15. The selector circuits 20-0 through 20-15 all have the same circuit construction, and each include transfer gates 21 through 28 and transfer gates 31 through 34, as demonstrably shown in the selector circuit 20-0. Each selector circuit receives 4 consecutive bits of the data signals DSIB(63:0)_0. The transfer gates 21 through 28 are controlled by 4 corresponding bits of the redundancy selection signals RED(63:0)_0. The transfer gates 21 through 28 make a selection as to whether to replace 4 corresponding bits of the data signals DSIB(63:0)_0 with the redundancy bit DSIBRED_0.

Furthermore, the transfer gates 31 through 34 select 1 bit from the 4 corresponding bits having undergone the redundancy processing based on the page selection signals PAGE (3:0). Consequently, the selector circuits 20-0 through 20-15 output signals DSO(0)_0 through DSO(15)_0, respectively. The circuit having the same construction as that of FIG. 2 and corresponding to the memory cell array 11-1 outputs signals DSO(0)_1 through DSO(15)_1. Furthermore, the circuit corresponding to the memory cell array 11-2 outputs signals DSO(0)_2 through DSO(15)_2, and the circuit corresponding to the memory cell array 11-3 outputs signals DSO(0)_3 through DSO(15)_3.

In this manner, redundancy bit replacement and page selection are performed.

FIG. 3 is a circuit diagram showing another portion of the multiplexer 13.

The portion of the multiplexer 13 shown in FIG. 3 is a circuit section that performs block selection. The circuit of FIG. 3 includes selector circuits 40-0 through 40-15. The selector circuits 40-0 through 40-15 all have the same construction, and each include transfer gates 41 through 44, as demonstrably shown in the selector circuit 40-0. A selector circuit 40-m (m=0–15) receives a 1 corresponding bit from each of the four circuits having the construction of FIG. 2 provided for the four respective blocks. That is, a total of 4 bits DSO(m)_0 through DSO(m)_3 are input. The transfer gates 41 through 44 selects one of the four input bits based on the block selection signals MUX_(3:0). As a result, the selector circuits 40-0 through 40-15 output signals DSO (0) through DSO (15), respectively, as signals after block selection.

In this manner, redundancy bit replacement, page selection, and block selection are performed.

Another related-art example is Japanese Patent Application Publication No. 6-150644, which is directed to a data selector that selects data retrieved from the memory block as secondary selection.

In the circuit of FIG. 2, the redundancy bit signal DSIBRED_0 that is a 1-bit signal is input into 64 transfer gates. This means that the load on the redundancy bit signal DSIBRED_n (n=0–3) is heavy, which requires the insertion of a buffer 16-n in the redundancy bit signal line 17-n in order to ensure proper operations, as shown in FIG. 1. The buffer 16-n needs capability to drive 64 signal lines, and is thus a large circuit element occupying a large area.

Further, the distance from each block (the memory cell arrays 11-0 through 11-3) to the multiplexer 13 is long, which gives rise to a problem in that the data signal lines 18-0 through 18-3 end up having the heavy capacitance load, resulting in slower data-read speed of memory cells.

Accordingly, there is a need for a semiconductor memory device which has a reduced circuit size with a construction in which the memory cell array is divided into blocks.

Moreover, there is a need for a semiconductor memory device which has an improved speed of memory cell read operation with a construction in which the memory cell array is divided into blocks.

SUMMARY OF THE INVENTION

It is a general object of the present invention to provide a semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages in accordance with the purpose of the invention, the invention provides a semiconductor memory device includes a plurality of blocks, each of which includes a memory cell array, and outputs data signals and a redundancy signal. The semiconductor memory device further includes at least one first multiplexer which is coupled to the blocks, and selects one of the blocks, and a second multiplexer which performs redundancy processing based on the data signals and the redundancy signal which have undergone block selection by the first multiplexer.

In the semiconductor memory device described above, the first multiplexer performs block selection, and, then, the second multiplexer carries out redundancy processing. This provision allows a buffer for driving the redundancy signal to be provided between the first multiplexer and the second multiplexer for the purpose of driving the redundancy signal having undergone the block selection. The number of buffers can thus be reduced compared with the related-art construction in which such buffers are provided for all the redundancy signals that are not yet subjected to block selection.

The first multiplexer may be provided as many as at least two, and each of such first multiplexers may be coupled to corresponding ones of the blocks. With this provision, the first multiplexers can be situated closer to the corresponding ones of the blocks than the second multiplexer is situated. This reduces the length of the data signal lines and the redundancy signal line, compared with conventional constructions. This reduces the load capacitance of the signal lines, thereby improving the data-read speed of memory cells.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
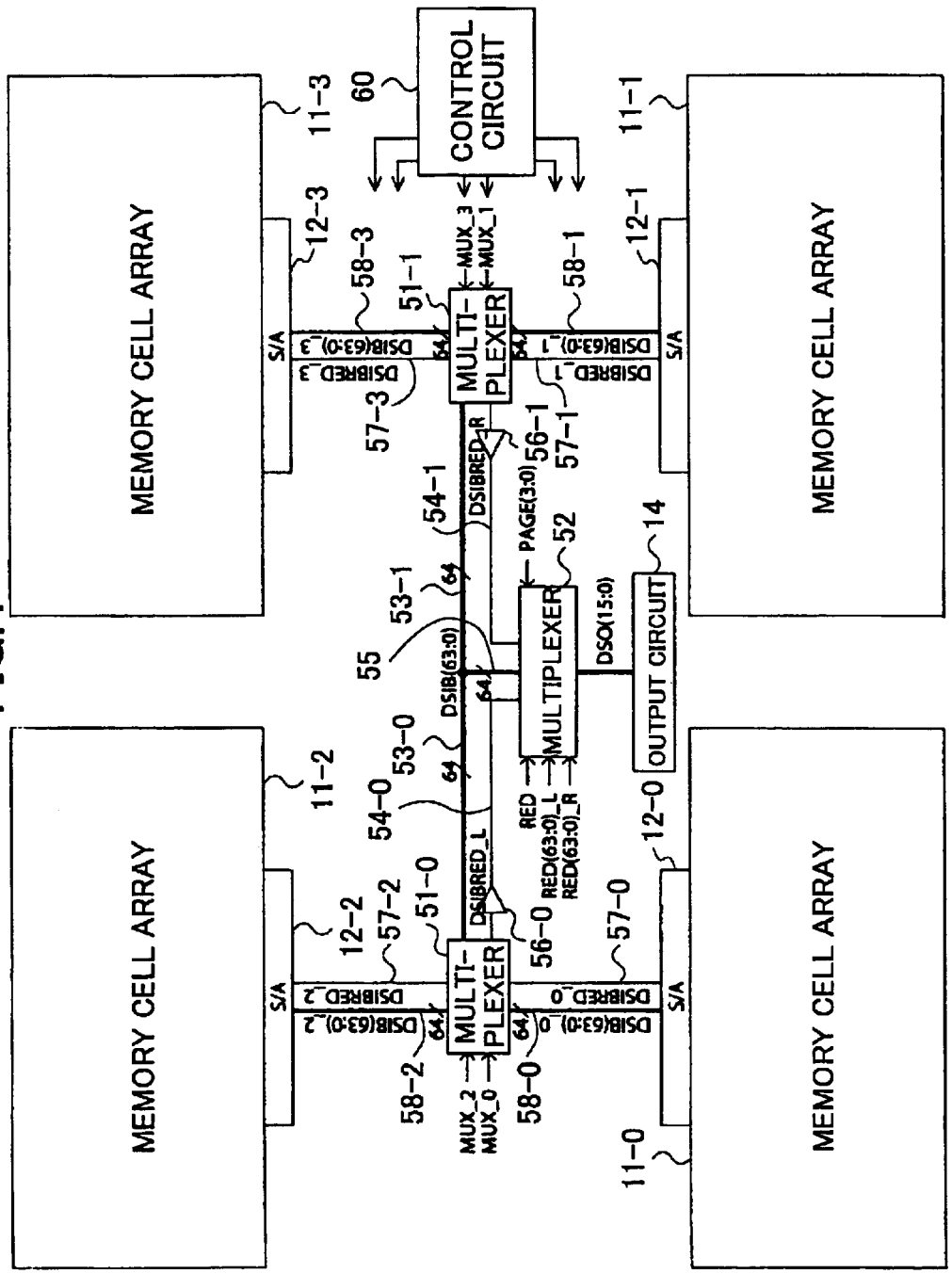
FIG. 4 is a block diagram showing an example of the construction of a semiconductor memory device according to the invention in which the memory cell block is divided into a plurality of blocks.

FIG. 4 is a block diagram showing an example of the construction of a semiconductor memory device according to the invention in which the memory cell block is divided into a plurality of blocks.

The semiconductor memory device of FIG. 4 includes memory cell arrays 11-0 through 11-3, sense amplifiers 12-0 through 12-3, an output circuit 14, multiplexers 51-0 and 51-1, a multiplexer 52, data signal lines 53-0 and 53-1, redundancy bit signal lines 54-0 and 54-1, data signal lines 55, buffers 56-0 and 56-1, redundancy bit signal lines 57-0 through 57-3, data signal lines 58-0 through 58-3, and a control circuit 60.

The memory cell arrays 11-0 through 11-3 include memory cells arranged in rows and columns, a plurality of word lines, a plurality of bit lines, an X decoder for selecting a word line, and a Y decoder for selecting a Y address. Data access to the memory cell arrays 11-0 through 11-3 is controlled by the control circuit 60. The sense amplifiers 12-0 through 12-3 are provided for the respective memory cell arrays 11-0 through 11-3, and amplify data read from memory cells. The amplified data that are read from the memory cell arrays 11-0 and 11-2 are supplied to the multiplexer 51-0 through the data signal lines 58-0 and 58-2. The amplified data that are read from the memory cell arrays 11-1 and 11-3 are supplied to the multiplexer 51-1 through the data signal lines 58-1 and 58-3. Similarly, redundancy bit signals read from the memory cell arrays 11-0 and 11-2 are amplified by the respective sense amplifiers 12-0 and 12-2, and are then supplied to the multiplexer 51-0 through the redundancy bit signal lines 57-0 and 57-2. The redundancy bit signals read from the memory cell arrays 11-1 and 11-3 are amplified by the respective sense amplifiers 12-1 and 12-3, and are then supplied to the multiplexer 51-1 through the redundancy bit signal lines 57-1 and 57-3. In this example, data signals DSIB(63:0)_n read from each memory cell array 11-n (n=0–3) are comprised of 64 bits, and a redundancy bit signal DSIBRED_n is 1 bit.

The multiplexer 51-0 selects retrieved signals (the data signals and the redundancy bit signal) corresponding to the selected memory cell array (block) chosen from the memory cell arrays 11-0 and 11-2. Such selection of the retrieved signals is made based on block selection signals MUX_0 and MUX_2. The selected data signals DSIB(63:0) are supplied to the multiplexer 52 via the data signal lines 53-0 and 55. The selected redundancy bit signal DSIBRED_L is supplied to the multiplexer 52 via the redundancy bit signal line 54-0 and the buffer 56-0. If neither the memory cell array 11-0 nor the memory cell array 11-2 is chosen, the output of the multiplexer 51-0 is placed in a floating state.

The multiplexer 51-1 selects retrieved signals (the data signals and the redundancy bit signal) corresponding to the selected memory cell array (block) chosen from the memory cell arrays 11-1 and 11-3. Such selection of the retrieved signals is made based on block selection signals MUX_1 and MUX_3. The selected data signals DSIB(63:0) are supplied to the multiplexer 52 via the data signal lines 53-1 and 55. The selected redundancy bit signal DSIBRED_R is supplied to the multiplexer 52 via the redundancy bit signal line 54-1 and the buffer 56-1. If neither the memory cell array 11-1 nor the memory cell array 11-3 is chosen, the output of the multiplexer 51-1 is placed in a floating state.

Since 4-to-1 selection has already been made by the block selection signals MUX_0 through MUX_3, the data signals DSIB (63:0) from the multiplexer 51-0 and the data signals DSIB(63:0) from the multiplexer 51-1 are combined together through hardwire connections. The combined signals are supplied to the multiplexer 52 through the data signal lines 55.

The multiplexer 52 decides whether to replace the 64 bits of the data signals DSIB(63:0) with the redundancy bit DSIBRED_L or DSIBRED_R. This decision is made based on the redundancy presence/absence signal RED indicative of the presence/absence of redundancy and the redundancy selection signals RED(63:0)_L and RED(63:0)_R, each of which is comprised of 64 bits. Furthermore, the multiplexer 52 selects one of the four pages defined by respective 16-bit subsets of 64 bits based on the page selection signals PAGE(3:0). The multiplexer 13 supplies 16-bit output data DSO(15:0) to the output circuit 14, and the output circuit 14 supplies this data to the exterior of the semiconductor memory device as read data.

Figure 5:
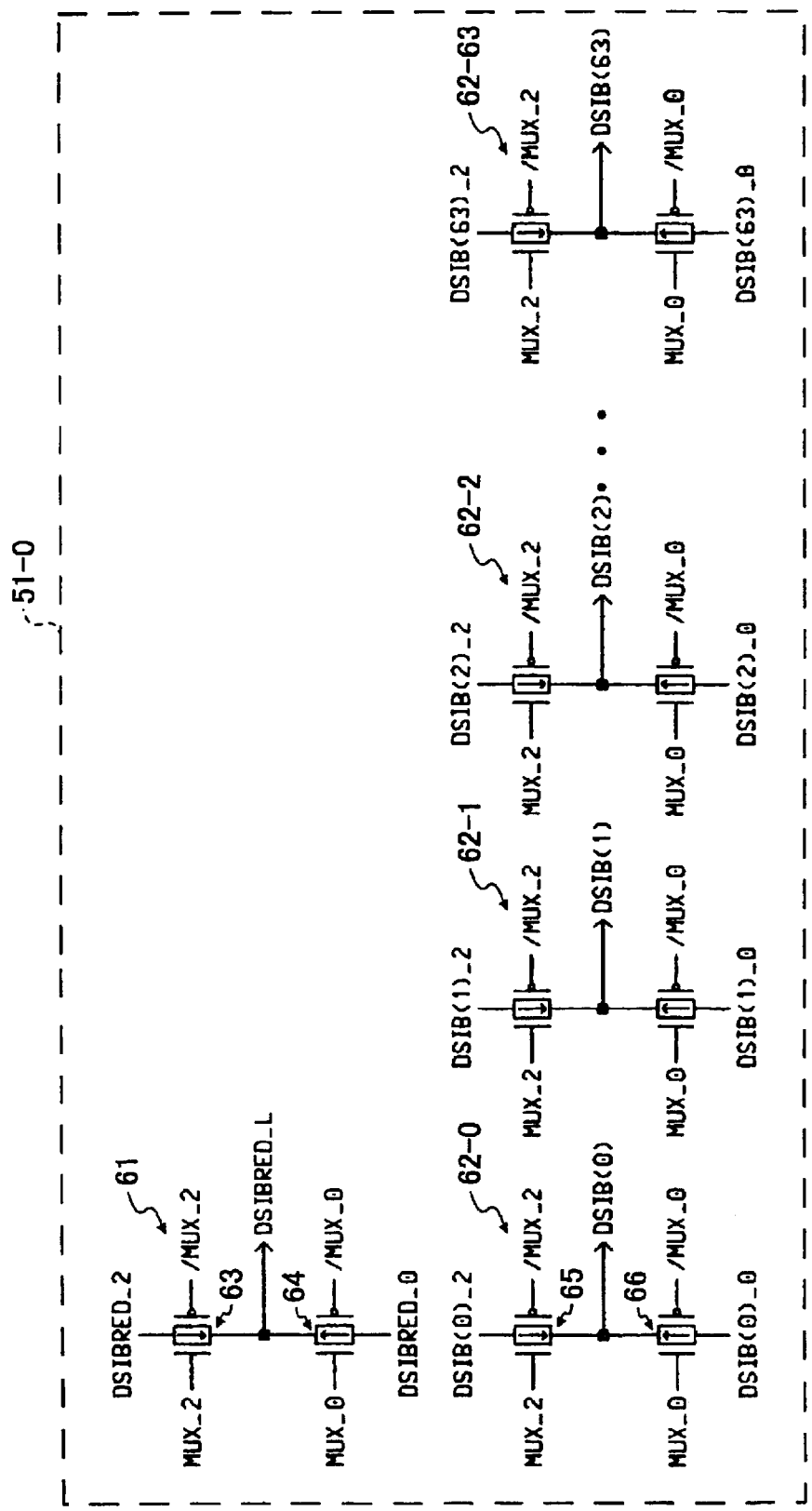
FIG. 5 is a circuit diagram showing the construction of a multiplexer 51-0.
Figure 6:
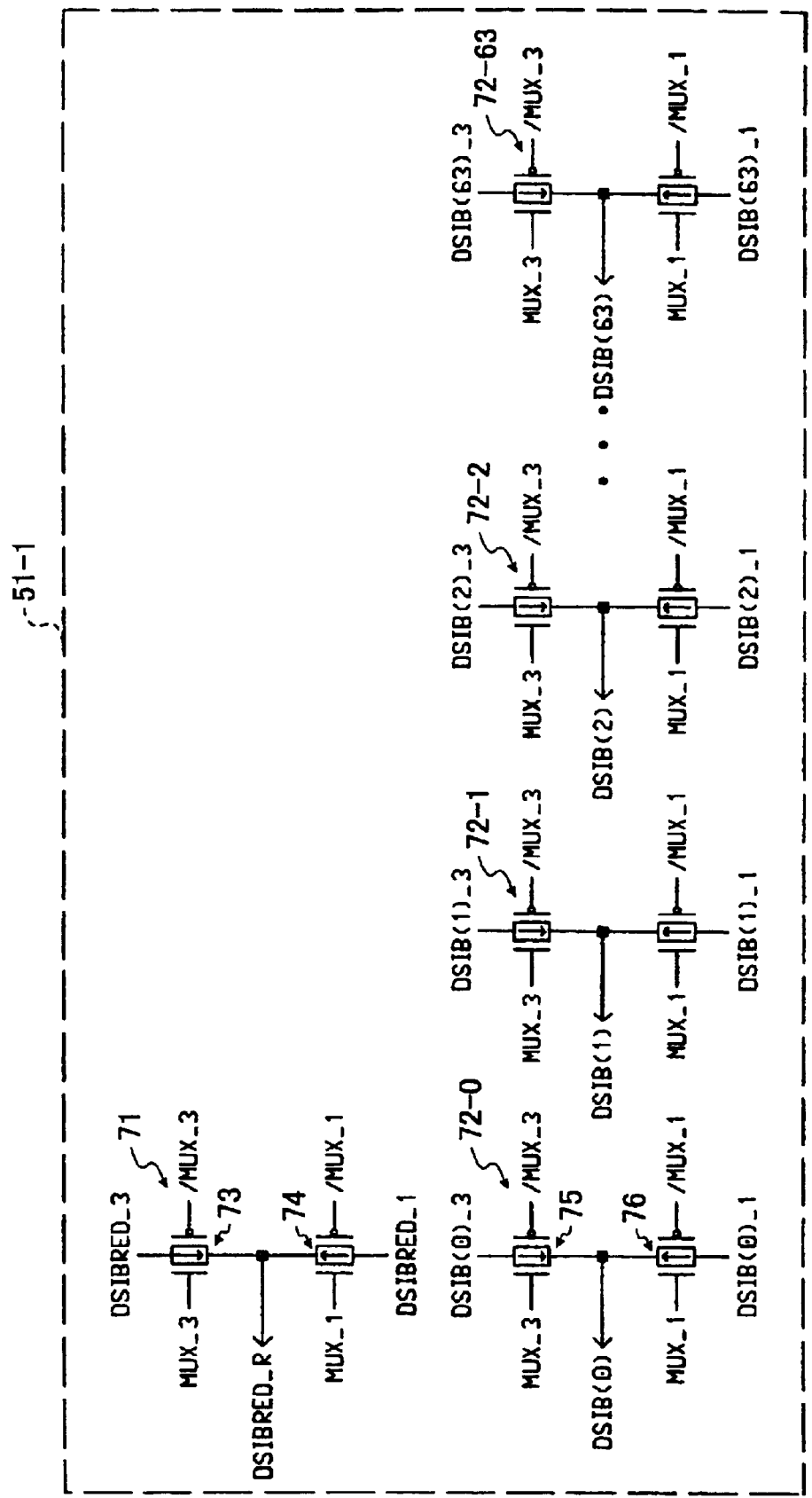
FIG. 6 is a circuit diagram showing the construction of a multiplexer 51-1.

FIG. 5 is a circuit diagram showing the construction of the multiplexer 51-0. FIG. 6 is a circuit diagram showing the construction of the multiplexer 51-1.

As shown in FIG. 5, the multiplexer 51-0 includes a selector circuit 61 and selector circuits 62-0 through 62-63. The selector circuit 61 includes transfer gates 63 and 64, and outputs a selected one of the redundancy bit signals DSIBRED_0 and DSIBRED_2 based on the block selection signals MUX_0 and MUX_2. The selector circuits 62-0 through 62-63 all have the same circuit construction, and each include transfer gates 65 and 66, as demonstrably shown in the selector circuit 62-0. A selector circuit 62-k (k=0–63) outputs a selected one of the corresponding data signals DSIB(k)_0 and DSIB(k)_2 based on the block selection signals MUX_0 and MUX_2.

As shown in FIG. 6, the multiplexer 51-1 includes a selector circuit 71 and selector circuits 72-0 through 72-63. The selector circuit 71 includes transfer gates 73 and 74, and outputs a selected one of the redundancy bit signals DSIBRED_1 and DSIBRED_3 based on the block selection signals MUX_1 and MUX_3. The selector circuits 72-0 through 72-63 all have the same circuit construction, and each include transfer gates 75 and 76, as demonstrably shown in the selector circuit 72-0. A selector circuit 72-k (k=0–63) outputs a selected one of the corresponding data signals DSIB(k)_1 and DSIB(k)_3 based on the block selection signals MUX_1 and MUX_3.

In this manner, block selection is performed by the multiplexers 51-0 and 51-1.

Figure 7:
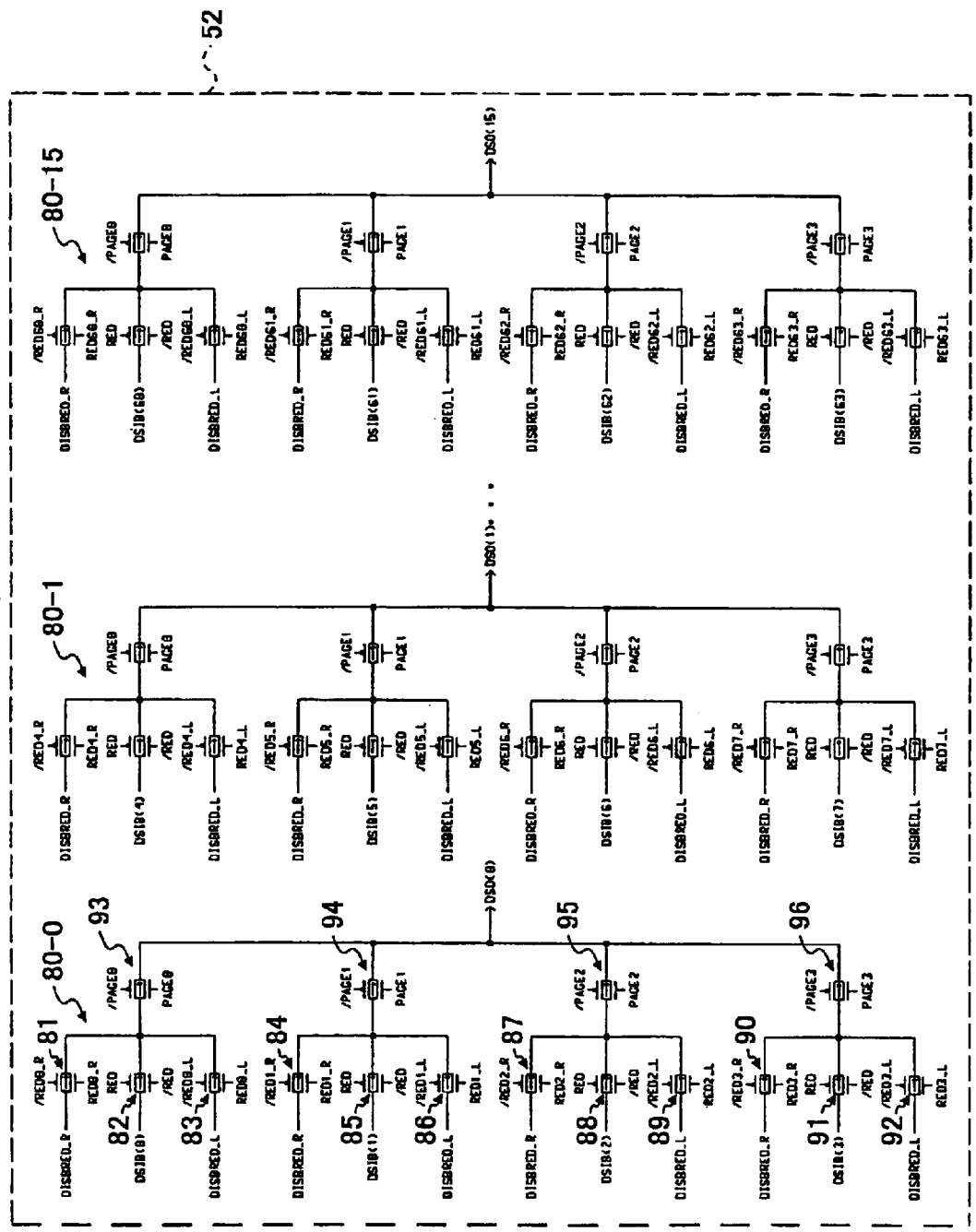
FIG. 7 is a circuit diagram showing the construction of a multiplexer 52.

FIG. 7 is a circuit diagram showing the construction of the multiplexer 52.

The multiplexer 52 of FIG. 7 includes selectors 80-1 through 80-15. The selector circuits 80-0 through 80-15 all have the same construction, and each include transfer gates 81 through 96, as demonstrably shown in the selector circuit 80-0. A selector circuit 80-m (m=0–15) receives 4 consecutive bits DSIB(4m) through DSIB(4m+3) that are a corresponding portion of the data signals DSIB (63:0). For example, the selector circuit 80-1 receives the data signals DSIB(4) through DSIB(7) that are the 4 consecutive bits of a corresponding portion of the data signal DSIB(63:0).

In each selector circuit 80-m (m=0–15) the transfer gates 81 through 92 are controlled by the redundancy presence/absence signal RED, the redundancy selection signal RED(4m)_L through RED(4m+3)_L, and the redundancy selection signals RED(4m)_R through RED(4m+3)_R. The transfer gates 81 through 92 decide whether to replace the data signals DSIB(4m) through DSIB(4m+3) with the redundancy bit DSIBRED_L or DSIBRED_R.

Furthermore, in each selector circuit 80-m (m=0–15), the transfer gates 93 through 96 select one of the four corresponding bits having undergone redundancy processing based on the page selection signal PAGE(3:0). With this provision, the selector circuits 80-0 through 80-15 output signals DSO(0) through DSO(15), respectively. These output signals are supplied to the output circuit 14.

In this manner, redundancy bit replacement and page selection are performed by the multiplexer 52.

Figure 1:
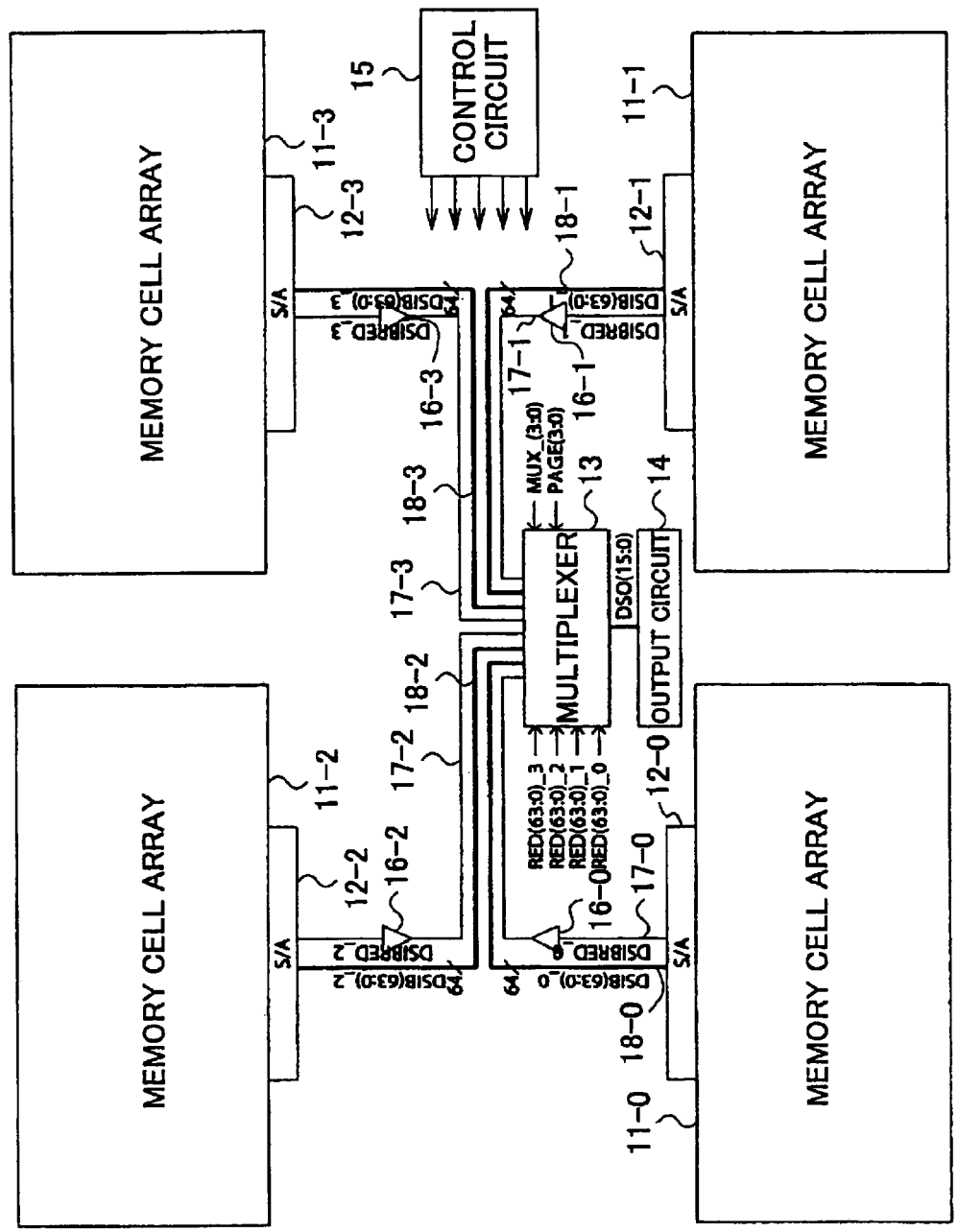
FIG. 1 is a block diagram showing an example of the construction of a related-art semiconductor memory device in which a memory cell block is divided into a plurality of blocks.
Figure 2:
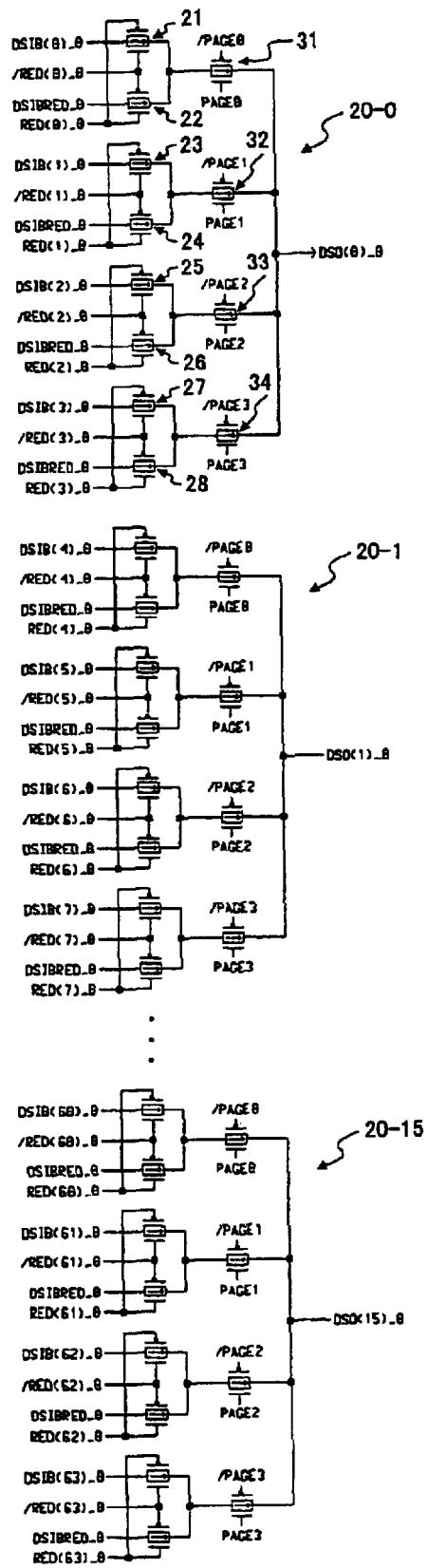
FIG. 2 is a circuit diagram showing a portion of a multiplexer.
Figure 3:
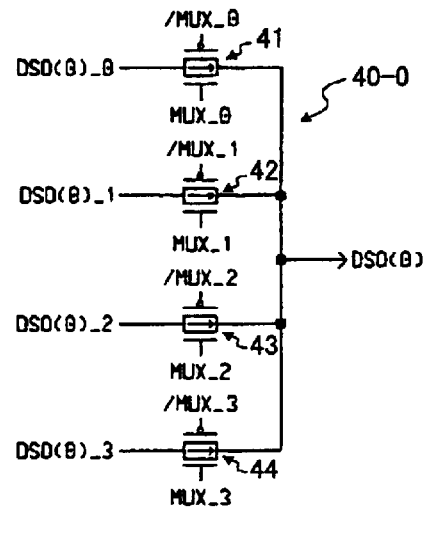
FIG. 3 is a circuit diagram showing another portion of the multiplexer.
Figure 3:
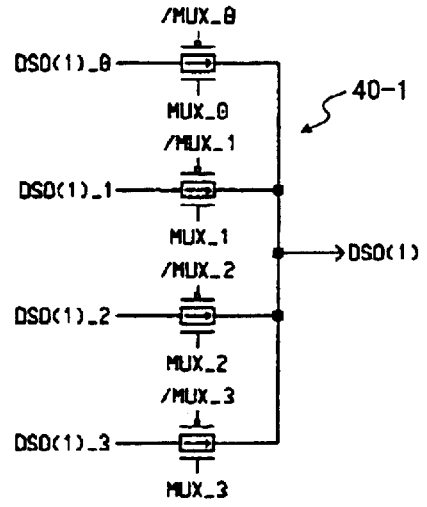
Figure 3:
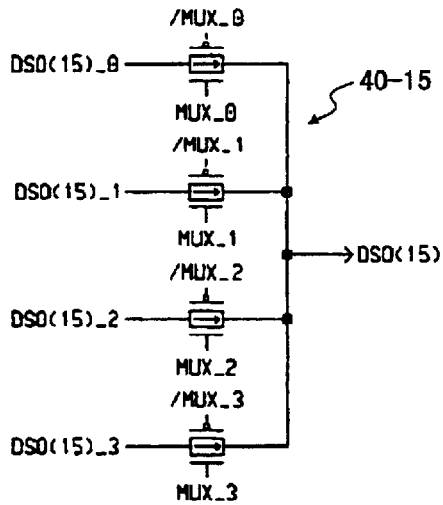

In the construction shown in FIG. 4, the multiplexer 51-0 and the multiplexer 51-1 are provided in the proximity of the memory cell arrays 11-0 and 11-2 and the memory cell arrays 11-1 and 11-3, respectively. The data signal lines 58-n (n=0–3) and the redundant bit signal lines 57-n (n=0–3) are thus shorter than the conventional data signal lines 18-n and the conventional redundant bit signal lines 17-n as shown in FIG. 1. With this provision, the load capacitance on the signal lines are reduced, thereby improving data-read speed of memory cells.

Moreover, provision is made to perform redundancy processing by the multiplexer 52 after the multiplexers 51-0 and 51-1 carry out block selection. As a result, it suffices to provide only the two buffers 56-0 and 56-1 for driving signal lines, which are half as many as the buffers provided in the related-art construction of FIG. 1. This advantageously reduces circuit size. In addition, the multiplexers 51-0 and 51-1 perform 4-to-1 block selection. The redundancy bit signal lines 54-0 and 54-1 can thus be coupled together by hardwire connection in a case in which only one bit of the redundancy bit signal of the selected block needs to be supplied to the multiplexer 52. The redundancy bit signal after the coupling is supplied to the multiplexer 52 through a single buffer. This further reduces circuit size.

Moreover, the construction of FIG. 4 further offers an advantage in that a cut-down can efficiently be performed. The "cut-down" means designing a semiconductor memory device with the 4-block construction as shown in FIG. 4 and subsequently designing and manufacturing another semiconductor memory device with a 2-block construction by utilizing the design data of the 4-block construction. With the construction of FIG. 4, it is easy to remove the two blocks (i.e., the memory cell arrays 11-2 and 11-3) of the upper half by leaving the other two blocks (i.e., the memory cell arrays 11-0 and 11-1) in the lower half. This is because it is possible to clamp the signal lines of the memory cell arrays 11-2 and 11-3 to a predetermined potential in the multiplexers 51-0 and 51-1, respectively. This can be done without changing the circuit design of the multiplexers 51-0, 51-1, and 52.

Moreover, the construction of FIG. 4 includes 66 incoming signal lines coupled to the multiplexer 52. This number is significantly smaller than 260 incoming signal lines coupled to the multiplexer 13 in the construction of FIG. 1. Consequently, manual labor required to move the position of the multiplexer 52 on the design layout is less intensive because of the reduction of the number of signal lines. This helps to achieve flexible circuit design.

Although the above embodiment has been described with reference to a case of four blocks, the numbers of blocks can be any other numbers. If six blocks are provided, for example, these six blocks may be grouped into three groups each including two blocks, and three selection means each equivalent to the multiplexer 51-0 may be provided to perform 6-to-1 block selection. After the block selection, redundancy processing and page selection processing may be carried out. Moreover, there is no need to collect transfer gates in one place to provide a configuration having 2 inputs and 1 output, as in the case of the multiplexers 51-0 and 51-1. The transfer gates may alternatively be arranged in the proximity of each block so as to control the passage/blockage of output signals from each block. That is, the transfer gates 65 of the multiplexer 51-0 may be arranged close to the memory cell array 11-2, and the transfer gates 66 of the multiplexer 51-0 may be arranged close to the memory cell array 11-0.

Further, the present invention is not limited to these embodiments, but various variations and modifications may be made without departing from the scope of the present invention.

What is claimed is:

1. A semiconductor memory device, comprising:

a plurality of blocks, each of which includes a memory cell array, and outputs data signals and a redundancy signal;

at least one first multiplexer which is coupled to the blocks, and selects one of the blocks; and a second multiplexer which performs redundancy processing based on the data signals and the redundancy signal which have undergone block selection by said at least one first multiplexer.

2. The semiconductor memory device as claimed in claim 1, wherein said second multiplexer further performs page selection.

3. The semiconductor memory device as claimed in claim 1, further comprising a buffer which is situated between said at least one first multiplexer and said second multiplexer to drive the redundancy signal.

4. The semiconductor memory device as claimed in claim 1, wherein said at least one first multiplexer includes two first multiplexers, each of which is coupled to corresponding ones of the blocks, and is situated closer to the corresponding ones of the blocks than said second multiplexer is.

5. The semiconductor memory device as claimed in claim 1, wherein the redundancy signal is a one-bit signal, and said second multiplexer decides whether to replace each bit of the data signals having undergone the block selection with the one bit of the redundancy signal.

6. The semiconductor memory device as claimed in claim 2, further comprising an output circuit which receives an output of said second multiplexer, and supplies the output to an exterior of said semiconductor memory device.

7. The semiconductor memory device as claimed in claim 1, further comprising a control circuit which controls said at least one first multiplexer and said second multiplexer.

* * * * *